United States Patent
Zhai et al.

(10) Patent No.: US 11,815,573 B2
(45) Date of Patent: Nov. 14, 2023

(54) MAGNETIC RESONANCE VOLUME COIL WITH MULTIPLE INDEPENDENT TRANSMIT RECEIVE CHANNELS

(71) Applicant: KONINKLIJKE PHILIPS N.V., Eindhoven (NL)

(72) Inventors: Zhiyong Zhai, Gainesville, FL (US); Paul Royston Harvey, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/773,683

(22) PCT Filed: Oct. 30, 2020

(86) PCT No.: PCT/EP2020/080479
§ 371 (c)(1),
(2) Date: May 2, 2022

(87) PCT Pub. No.: WO2021/089417
PCT Pub. Date: May 14, 2021

(65) Prior Publication Data
US 2022/0390536 A1 Dec. 8, 2022

Related U.S. Application Data

(60) Provisional application No. 62/930,607, filed on Nov. 5, 2019.

(30) Foreign Application Priority Data

Nov. 19, 2019 (EP) .................................... 19210015

(51) Int. Cl.
*G01R 33/3415* (2006.01)
*G01R 33/34* (2006.01)

(52) U.S. Cl.
CPC ... *G01R 33/3415* (2013.01); *G01R 33/34046* (2013.01)

(58) Field of Classification Search
CPC .......... G01R 33/3415; G01R 33/34046; G01R 33/34038; G01R 33/34053; G01R 33/5659
See application file for complete search history.

(56) References Cited

U.S. PATENT DOCUMENTS

| 6,522,143 B1 | 2/2003 | Fujita et al. |
| 2005/0107684 A1* | 5/2005 | Weyers ............ G01R 33/34046 324/318 |

(Continued)

FOREIGN PATENT DOCUMENTS

| JP | 1156806 A | 3/1999 |
| KR | 101820779 B1 | 1/2018 |

OTHER PUBLICATIONS

Jan Paska et al. "A Hybrid 8 Channel TR Dipole and 8 Channel RX Birdcage Body Coil Array for 7T" Proceedings of the Int. Soc. for Magnetic Reson. in Med. May 7-13, 2016.

(Continued)

*Primary Examiner* — Rishi R Patel

(57) ABSTRACT

An ultra-high field radio-frequency (RF) transmit/receive apparatus radio-frequency (RF) transmit/receive apparatus for magnetic resonance (MR) systems, may include: a dipole-array based volume coil (2) with a plurality of straight dipole antennas (3); at least three circular conducting rings (4, 5, 6) radial surrounding the dipole-array based volume coil (2), the at least three circular conducting rings (4, 5, 6) being substantially parallel with each other, having a plurality of ports (9, 10) for receiving a set of quadrature (Continued)

drive signals, the RF coil apparatus further comprising at least two independent transmit/receive (T/R) RF channels (11, 12, 13, 14) for driving the dipole-array based volume coil (2) and the at least three circular conducting rings (4, 5, 6).

19 Claims, 5 Drawing Sheets

(56) References Cited

U.S. PATENT DOCUMENTS

| | | |
|---|---|---|
| 2013/0147475 A1 | 6/2013 | Yang et al. |
| 2014/0239953 A1 | 8/2014 | Luong et al. |
| 2015/0130465 A1 | 5/2015 | Wiggins |
| 2017/0214138 A1 | 7/2017 | Erturk et al. |
| 2018/0246179 A1 | 8/2018 | Zhai et al. |

OTHER PUBLICATIONS

Kim et al. "Numerical Calculations of Multi-Channel Receiver Coil Array With High-Pass Spoke Coil for Parallel MRI" Journal of the Korean Physics Society vol. 74, No. 11, Jun. 11, 2019 p. 1073-1078.
International Search Report and Written Opinion from PCT/EP2020/080479 dated Feb. 1, 2021.
Tian et al. "Design Considerations for Dipole for Head MRI At 10.5T" 2015 IEEE MTT-S 2015 International Microwave Workshop Series on RF and Wireless Technologies for Biomedical and Healthcare Applications (IMWS-BIO) Sep. 21-23, 2015.
Hong et al. "Design of a Quadrature 1H/31P Coil Using Bend Dipole Antenna and Four-Channel Loop at 3T MRI " IEEE Transactions on Medical Imaging vol. 37, No. Dec. 12, 2018.
Paska et al. "A Rigid, Stand-Off Hybrid Dipole, and Birdcage Coil Array for 7T Body Imaging" Magnetic Resonance in Med. 80: p. 822-832 (2018).
Nakajima et al "Development of a Patch Antenna Array RF Coil for Ultra-High Field MRI" Magnetic Reson. in Med. Sci. vol. 6, No. 4, pp. 231-233 (2007).

* cited by examiner

MAGNETIC RESONANCE VOLUME COIL WITH MULTIPLE INDEPENDENT TRANSMIT RECEIVE CHANNELS

CROSS REFERENCE TO RELATED APPLICATIONS

This application is a U.S. national phase application of International Application No. PCT/EP2020/080479 filed on Oct. 30, 2020, which claims the benefit of EP Application Serial No. 19210015.4 filed on Nov. 19, 2019 and U.S. Application Ser. No. 62/930,607 filed Nov. 5, 2019 and is incorporated herein by reference.

FIELD OF THE INVENTION

The invention relates to the field of radio frequency (RF) volume coil for magnetic resonance (MR) imaging (MRI) and spectroscopy (MRS) systems and, more particularly, to an ultra-high-field RF volume coil with enhanced transverse RF magnetic ($B_1^+$) field uniformity and $B_1^+$ shimming capability.

BACKGROUND OF THE INVENTION

Ultra-high-field MRI systems have become commercially available for both research purposes and clinical use in limited anatomies at the present time. Unfortunately, at ultra-high fields such as 7 T and above, $B_1^+$ field generated by conventional MRI system's RF transmit coils is increasingly non-uniform due to the increase in patient's tissue dielectric (wavelength) effect. Although, multiple-element transmit/receive (T/R) surface coils arranged to cover a volume of interest and with multiple T/R channels can be used in an effort to improve the uniformity of the $B_1^+$ field (e.g., $B_1^+$ uniformity), this approach is technically complex and suffers from limited $B_1^+$ uniformity. Accordingly, embodiments of the present system may overcome these and other disadvantages of conventional ultra-high-field MRI and MRS systems.

From US 2018/0246179 A1 a magnetic resonance (MR) system is known comprising: a volume-type radio-frequency (RF) coil assembly having a volume coil with a plurality of ports and a ring coil with a plurality of ports and which is situated about the volume-type coil; and at least one controller configured to selectively control a first transmit/receive (T/R) radio frequency (RF) channel to generate an output including RF quadrature signals to drive the volume-type coil and to selectively control a second T/R RF channel to generate an output including RF quadrature signals to drive the ring coil.

From U.S. Pat. No. 6,522,143 B1 a magnetic resonance apparatus including a main magnetic field source for providing a magnetic field ($B_0$) along a main field axis is known. A transmitter and transmit coils excite a nuclei of an object to resonate. The resonating nuclei generate magnetic resonance signals detected by a volume coil including a pair of end rings separated along a coil axis. The end rings are electrically interconnected by a plurality of rungs disposed about the rings. A conductive loop is concentrically disposed between and inductively coupled to the end rings. The loop includes an electrical conductor preferably surrounding the rungs, and positioned parallel to the end rings. A capacitive element, in electrical communication with the conductor, is selected or adjusted to tune the loop to signals at a selected frequency. Moreover, the loop is slidably positionable along the coil axis and has an adjustable capacitor to match or tune the loop to signals at the selected frequency.

Furthermore, dipole antenna arrays are known from the state of the art, which are commonly used to construct volume transmit/receive coils for ultra-high-field MRI.

From US 2015/0130465 A1 an apparatus including a plurality of electric dipole antenna arrangements, and a processing arrangement configured to receive a signal(s) from the electric dipole antenna arrangements, and generate a magnetic resonance image based on the signal(s) is known. Each of the electric dipole antenna arrangements can have at least two poles extending in opposite directions from each other. One of the poles can have a curved shape, which can bifurcate and follow two mirror symmetric S-shapes.

Dipole antenna arrays with a fixed number of independent transmit/receive channels have limits in term of improving $B_1^+$ field uniformity and receive coil sensitivity.

SUMMARY OF THE INVENTION

It is an object of the invention to provide a (RF) coil apparatus for magnetic resonance (MR) systems with improved transmit $B_1^+$ shimming and optimized receive signal-to-noise ratio (SNR) for MRI systems with a limited number of T/R channels.

According to the invention, this object is addressed by the subject matter of the independent claims. Preferred embodiments of the invention are described in the sub claims.

Therefore, according to the invention, an ultra-high field radio-frequency (RF) transmit/receive apparatus for magnetic resonance (MR) systems is provided, the RF coil apparatus comprising: a dipole-array based volume coil, the dipole-array based volume coil comprising a plurality of straight dipole antennas wherein the straight dipole antennas being substantially parallel with each other and within a cylindrical RF shield, the RF coil apparatus further comprising: at least three circular conducting rings radial surrounding the dipole-array based volume coil, wherein a first circular conducting ring is located at one of the opposed axial ends of the dipole-array based volume coil, wherein a second circular conducting ring located at the opposite end of the dipole-array based volume coil, wherein a third circular conducting ring is located between the first circular conducting ring and the second circular conducting ring surrounding the center of dipole-array based volume coil, the first conducting ring, second conducting ring and third conducting ring being substantially parallel with each other, wherein at least the third circular conducting ring has a plurality of ports for receiving a set of quadrature drive signals, the apparatus further comprising at least two independent transmit/receive (T/R) RF channels for driving the dipole-array based volume coil and the at least three circular conducting rings.

The main idea of the invention is to combine three conducting rings with a dipole-array based volume coil. The three rings generate extra transverse $B_1^-$ field components for improved $B_1^+$ shimming and signal-to-noise ratio (SNR). With the proposed (RF) coil apparatus, transmit $B_1^+$ shimming and receive signal-to-noise ratio (SNR) optimization can be performed to improve MR imaging quality at ultra-high fields such as 7T and above.

The RF transmit/receive apparatus of the invention comprises a dipole-array based volume coil with straight dipole antennas arranged in a cylindrical configuration mutually parallel along the axial direction. The axial direction is along the longitudinal axis of the cylindrical configuration. First and second circular conducting rings are placed at opposite axial ends of the cylindrical configuration. A third circular conducing ring is placed axially between the first and second circular conducting rings. The conducting rings are arranged surrounding the dipole-array based volume coil. For example, the conducting rings are placed radially outside from the straight dipoles antennae of the dipole-array based volume coil. In particular the circular conducting rings may be arranged transversely to the longitudinal axis. For example, two circular conducting rings may be placed in radial planes at the axial opposite ends, respectively with the third circular conducting ring placed in a radial plane axially in between the axial opposite ends.

At least two independent transmit/receive channels are provided for driving the dipole-array based volume coil and the circular conducting rings. In particular, the third (middle) circular conductive ring is fitted with ports for receiving quadrature drive signals. To that end, respective independent transmit/receive channels are coupled to the respective ports of the third (middle) circular conductive ring so as to drive the third (middle) circular conductive ring in quadrature mode.

In another disclosed aspect, at least one transmit/receive (T/R) RF channel is assigned to each straight dipole antenna, one channel is assigned to the first circular conducting ring and to the second circular conducting ring, one channel is assigned to a first port of the third circular conducting ring and to a second port of the third circular conducting ring.

It is further envisioned that the apparatus comprises a power splitter and a 180° phase shifter, wherein the channel assigned to the first circular conducting ring and the second circular conducting ring, is assigned to the first circular conducting ring and the second circular conducting ring through the power slitter and the 180° phase shifter.

In accordance with embodiments of the present apparatus, the apparatus comprises a quadrature hybrid coupler, wherein the channel assigned to the first port of the third circular conducting ring and to the second port of the third circular conducting ring is assigned to the first port of the third circular conducting ring and to the second port of the third circular conducting ring through the quadrature hybrid coupler, wherein the first port and the second port are 90° azimuthal apart along the third circular conducting ring.

It is further envisioned that at least one transmit/receive (T/R) RF channel is assigned to each straight dipole, one channel is assigned to the first circular conducting ring, one channel is assigned to the second circular conducting ring, one channel is assigned to a first port of the third circular conducting ring and one channel is assigned to a second port of the third circular conducting ring.

It is further envisioned that the straight dipole antennas and the circular conducting rings are tuned to the same resonant frequency of MRI.

In accordance with embodiments of the present apparatus, capacitors and/or inductors are placed in each straight dipole antenna to tune the straight dipole antennas to have the maximum current in the middle of each straight dipole antenna.

It is further envisioned that capacitors and/or inductors are evenly distributed along the first circular conducting ring and along the second circular conducting ring for tuning the first circular conducting ring and the second circular conducting ring to a resonant mode with a uniform current distribution along the first circular conducting ring and the second circular conducting ring.

In accordance with embodiments of the present apparatus, capacitors and/or inductors are evenly distributed along the third circular conducting ring for tuning the third circular conducting ring to a resonant mode with a sinusoidal current distribution along the third circular conducting ring.

It is further envisioned that the ultra-high field radio-frequency (RF) transmit/receive apparatus comprises a RF shield, wherein the RF shield is situated about the dipole-array based volume coil and the at least at least three circular conducting rings.

The present invention also provides a magnetic resonance (MR) system, comprising an ultra-high field radio-frequency (RF) transmit/receive apparatus according to the apparatus as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
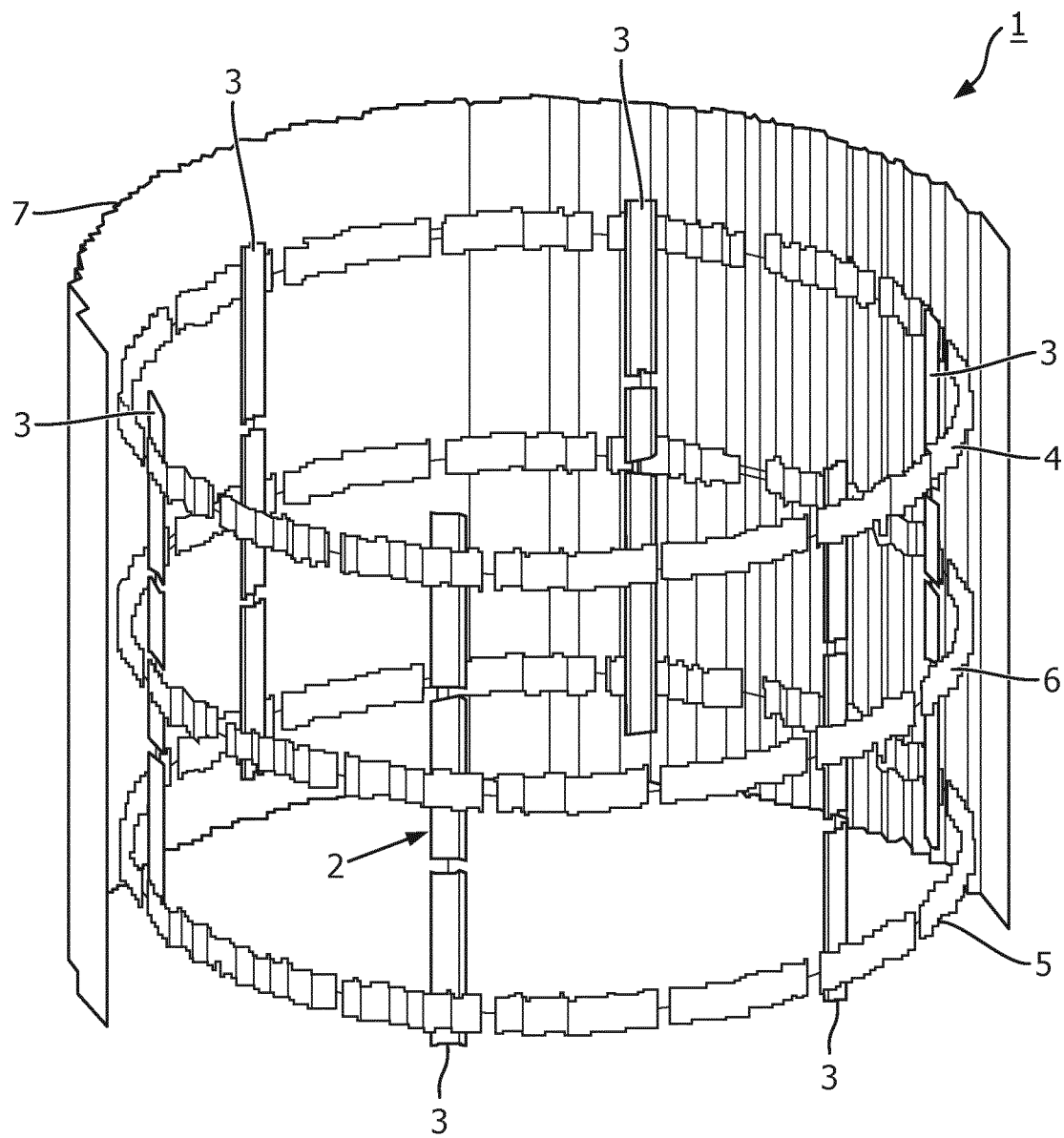
FIG. 1 shows a partially cutaway front perspective view of an ultra-high field radio-frequency (RF) transmit/receive apparatus in accordance with embodiments of the present invention.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

FIG. 1 shows a partially cutaway front perspective view of an ultra-high field radio-frequency (RF) transmit/receive apparatus 1 in accordance with embodiments of the present invention. The RF coil apparatus 1 may be configured to operate as a transmit/receive volume coil which may be compatible with various frequencies and/or field strengths such as ultra-high-field MRI and MRS. The RF coil 1 may include one or more of a dipole-array based volume coil 2, at least three circular conducting rings 4, 5, 6 radial surrounding the dipole-array based volume coil 2, and a RF shield which may surround at least portions of at least one of the dipole-array based volume coil 2 and the at least three circular conducting rings 4, 5, 6. Between the dipole-array based volume coil 2 and the least three circular conducting rings 4, 5, 6 there are no physical contacts or electronic connections. The dipole-array based volume coil 2 comprises several straight dipole antennas 3. The dipole-array based volume coil has a length $L_{vc}$ (e.g., the measured length of the straight dipole antennas) and a diameter $d_{vc}$. A first circular conducting ring 4 is located at one of the opposed axial ends of the dipole-array based volume coil 2, wherein a second circular conducting ring 5 is located at the opposite end of the dipole-array based volume coil 2. A third circular conducting ring 6 is located between the first circular conducting ring 4 and the second circular conducting ring 5 surrounding the center of the dipole-array based volume coil 2. The at least three circular conducting rings 4, 5, 6 being substantially parallel with each other. The three circular conducting rings 4, 5, 6 may include a diameter which may be larger than the diameter of the dipole-array based volume coil 2 so that the circular conducting rings 4, 5, 6 may encircle the dipole-array based volume coil 2.

At least one of circular conducting rings may include N (where N is an integer greater than 2) ports. For example, if N=4, then one of the circular conducting rings may include four ports such as port-1, port-2, port-3, and port-4 (generally port-n). Each of these ports may be spatially located about 90° apart from an adjacent port. The ports (port-n) may be located such that they may be coupled at a corresponding capacitor of the corresponding circular conducting rings. The ports (port-n) may be identified by angular location about the opposed ring. Thus, port-1 through port-4 may be referred to as 0°, 90°, 180°, and 270° ports (p), respectively, for N=4. For example, if the one of the circular conducting rings includes 2 or 4 ports, then these ports may be spatially 90°-azimuthally apart from an adjacent port or ports. Each of the ports (port-n) may be coupled to an RF controller by corresponding signal leads. Accordingly, the signal leads may provide a drive/excitation signal to a corresponding port (port-x) that causes a magnetic resonance excitation effect where a subsequent magnetic resonance signal is then received by the circular conducting ring and is provided to the RF controller or further processing such as for reconstruction, etc.

The three circular conducting rings 4, 5, 6 may be tuned to a desired resonance frequency using any suitable method. For example, it is envisioned that the circular conducting rings 4, 5, 6 may be tuned by reactance elements such as capacitive gaps and/or discrete and/or distributed capacitors (hereinafter both of which may be referred to as capacitors for the sake of clarity), by adjusting in the width of the circular conducting rings 4, 5, 6, adjusting the diameter of the circular conducting rings 4, 5, 6 by filling a space between circular conducting rings 4, 5, 6 and RF shield 7 with dielectric materials, by adding inductances in the capacitive gaps, and/or suitable combinations thereof. For example, the circular conducting rings 4, 5, 6 may include a plurality of conductive segments capacitively coupled together by capacitors e.g. formed by capacitive gaps, situated between the conductive segments.

In accordance with embodiments of the present system, the capacitors may be placed along a circumference of the circular conducting rings 4, 5, 6 at even intervals from each other so as to be evenly spaced. For example, in accordance with some embodiments, if the total number of capacitors M=16, then these capacitors may be placed at 360 deg/(M)=360 deg/16=22.5 degree intervals. The total number of capacitors and/or capacitance of each of the circular conducting ring 4, 5, 6 may be substantially equal to each other.

The RF shield 7 may be placed outside of, and surrounding, the dipole-array based volume coil 2 and the at least three circular conducting rings 4, 5, 6, respectively. The shield may include any suitable RF shield 7 and may have any suitable shape, such as a cylindrical shape, and may be formed from any suitable material, such as thin copper or an or equivalent type of shielding material or materials compatible with MRI uses. For example, in accordance with some embodiments, the RF shield 7 may be formed from a conductive mesh, such as a copper mesh, non-magnetic stainless steel mesh, segmented copper in a printed circuit board type construction, or the like. The RF shield 7 may be grounded, if desired. In accordance with embodiments of the present system, the RF shield 7 may fit uniformly around the dipole-array based volume coil 2 and/or the at least three circular conducting rings 4, 5, 6 respectively. The main purpose of the RF shield 7 is to mitigate radiation losses of the dipole-array based volume coil 2 and/or the at least three circular conducting rings 4, 5, 6 and to isolate these components from the external components of the bore, such as gradient coils and the like.

The in FIG. 1 proposed ultra-high field radio-frequency (RF) transmit/receive apparatus 1 is a transmit/receive (T/R) volume coil intended for multiple-channel ultra-high field MRI. In this example ultra-high field radio-frequency (RF) transmit/receive apparatus comprises a total of eight independent T/R channels. In practice, all the straight dipole antennas 3 of the dipole-array based volume coil 2 and the at least three circular conducting rings 4, 5, 6 can transmit and receive RF signals independently to use with a predefined number of independent RF T/R channels.

FIG. 2 shows a schematic diagram of a power splitter 15 and a quadrature hybrid coupler 17 for driving a two-port-type ultra-high field radio-frequency (RF) transmit/receive apparatus 1 in accordance with embodiments of the present invention.

Figure 2A:
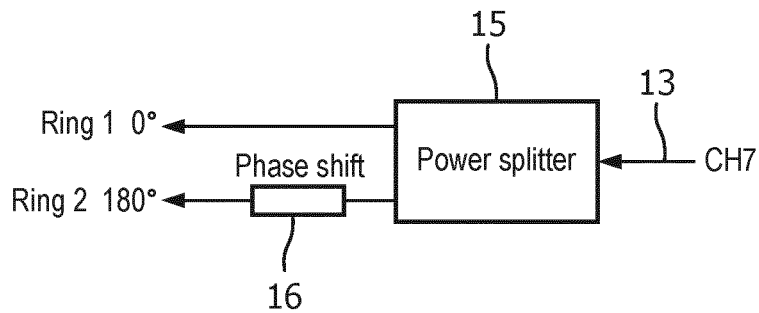
FIG. 2 shows a schematic diagram of a power splitter and a quadrature hybrid coupler for driving a two-port-type ultra-high field radio-frequency (RF) transmit/receive apparatus in accordance with embodiments of the present invention.
Figure 2B:
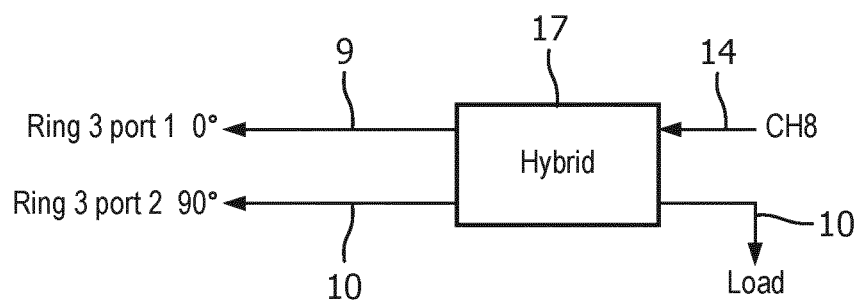

In one embodiment as shown in FIG. 2, the eight-channel ultra-high field radio-frequency (RF) coil 1 apparatus from FIG. 1 consisting of six dipoles 3 and three circular conducting rings 4, 5, 6, wherein the six dipoles 6 are assigned to the first six transmit channels CH1 to CH6, respectively. Transmit channel seven 13 is assigned to both the first circular conducting ring 4 and the second circular conducting ring 5 through a power splitter 15 and a 180° phase shifter as shown in FIG. 2A. Channel eight 14 is assigned to a first port and a second port of the third circular conducting ring 6 through a quadrature hybrid coupler, as shown in FIG. 2B. The first port and the second port are 90° azimuthal apart along the third circular conducting ring.

Figure 3:
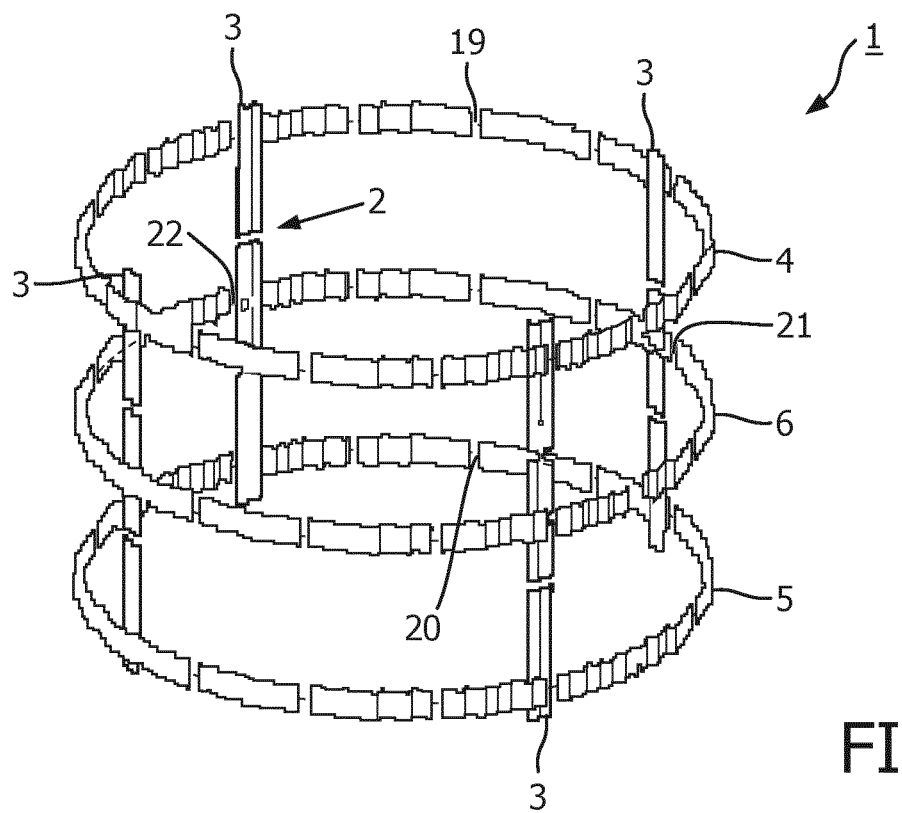
FIG. 3 shows a front perspective side view of the ultra-high field radio-frequency (RF) transmit/receive apparatus with four electric dipole antennas and three circular conducting rings in accordance with embodiments of the present invention.

FIG. 3 shows a front perspective side view of the ultra-high field radio-frequency (RF) transmit/receive apparatus 1 with four electric dipole antennas 3 and three circular conducting rings 4, 5, 6 in accordance with embodiments of the present invention.

In an embodiment of the present apparatus the eight-channel ultra-high field radio-frequency (RF) transmit/receive apparatus 1 from FIG. 1 consists of four straight dipole antennas 3 and three circular conducting rings 4, 5, 6. Four transmit channels are assigned to four straight dipole antennas 3, respectively. Channel five 19 and Channel six 20 are assigned to the first and second circular conducting ring. Channel seven is assigned to first port of the third circular conducting ring, and channel 8 is assigned to a second port of the third circular conducting ring.

Figure 4:
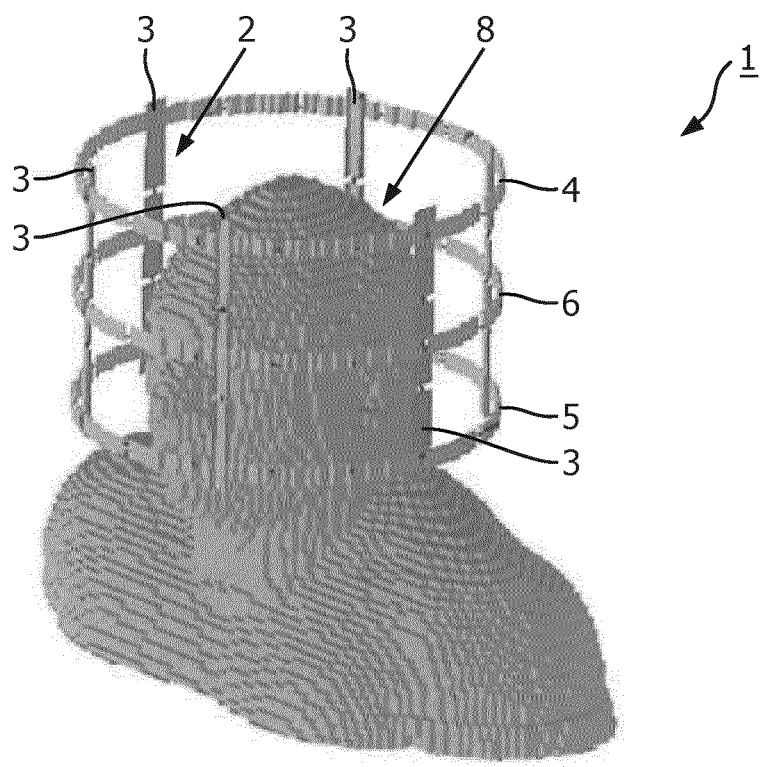
FIG. 4 shows a partially cutaway front perspective view of a finite-difference time-domain (FDTD) numerical model of an ultra-high field radio-frequency (RF) transmit/receive apparatus with a model head therein in accordance with embodiments of the present invention.
Figure 5:
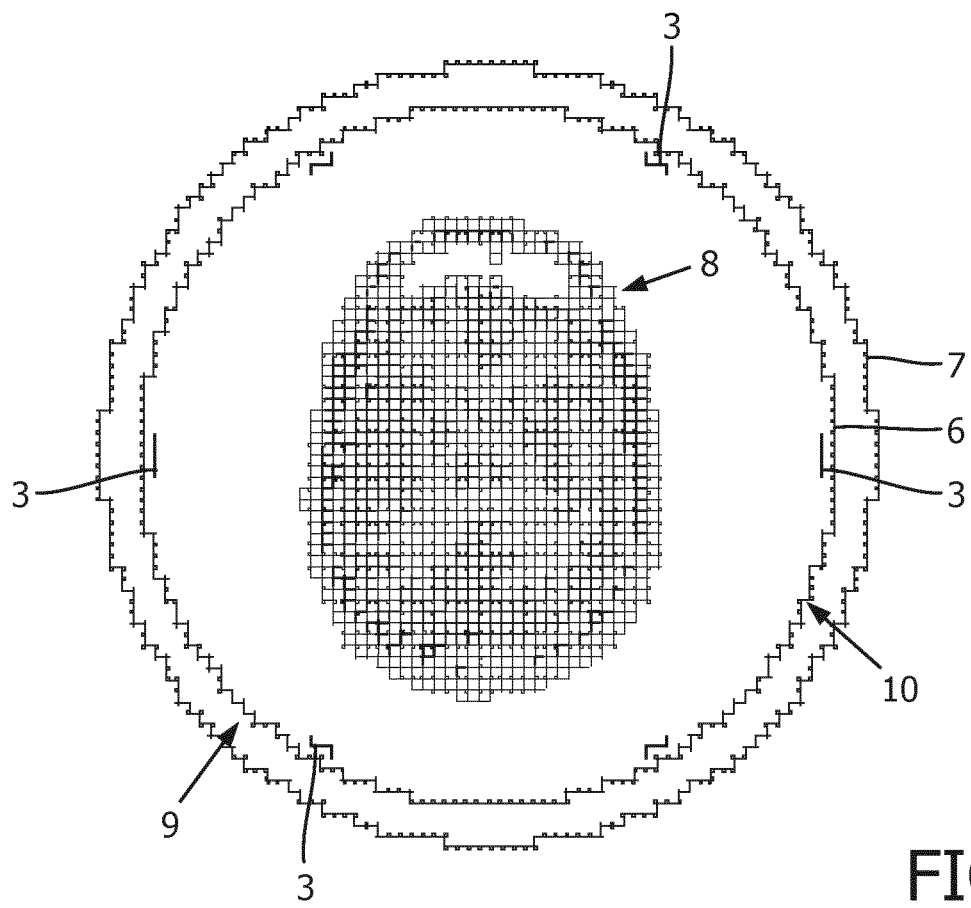
FIG. 5 shows a graph of a center transverse slice (S) of the model head and the ultra-high field radio-frequency (RF) transmit/receive apparatus taken along the third conducting ring of the model of FIG. 2 in accordance with embodiments of the present invention.
Figure 6A:
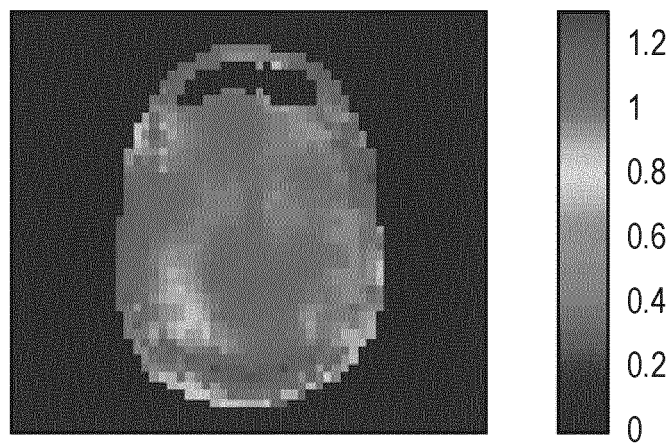
FIG. 6 shows graphs of a normalized $|B_1^+|$-field (i.e., $|B_1^+|/|B_1^+|_{avg}$) for the center transverse, sagittal and coronal slices of the human head model where $\|B_1^+|_{avg}$ is the average $|B_1^+|$ over the center transverse, sagittal and coronal slices, acquired with an ultra-high field radio-frequency (RF) transmit/receive apparatus with six electric dipole antennas and three circular conducting rings in accordance with embodiments of the present invention.
Figure 6B:
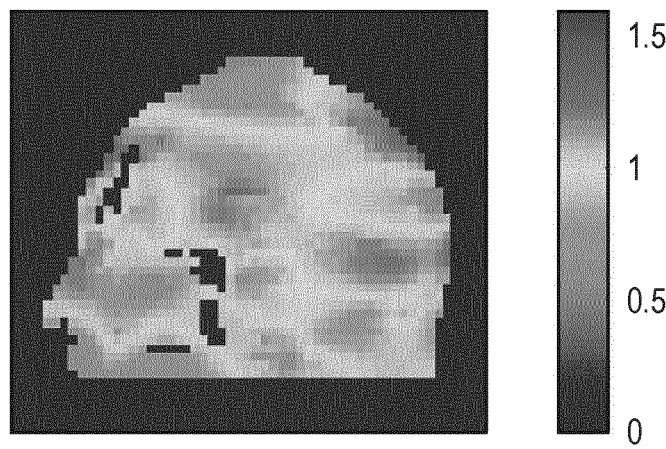
Figure 6C:
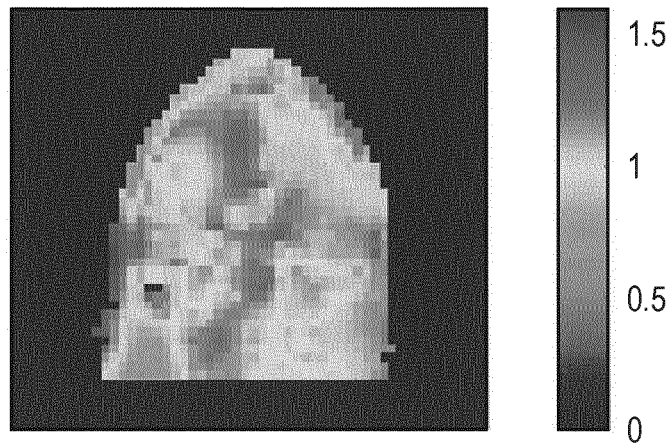
Figure 7A:
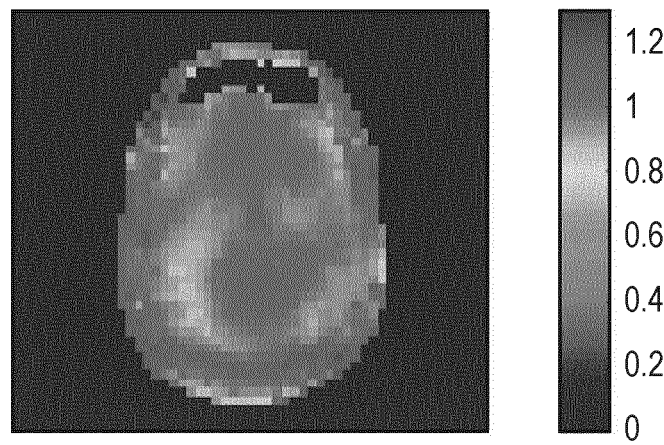
FIG. 7 shows graphs of a normalized $|B_1^+|$-field (i.e., $|B_1^+|/|B_1^+|_{avg}$) for the center transverse, sagittal and coronal slices of the human head model where $|B_1^+|_{avg}$ is the average $|B_1^+|$ over the center transverse, sagittal and coronal slices, acquired with an ultra-high field radio-frequency (RF) transmit/receive apparatus with four electric dipole antennas and three circular conducting rings in accordance with embodiments of the present invention.
Figure 7B:
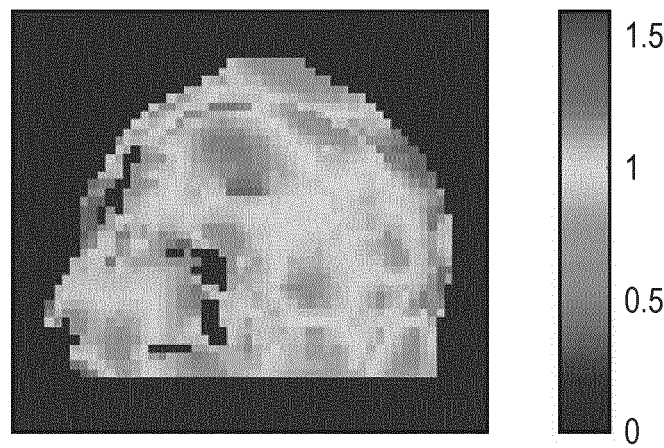
Figure 7C:
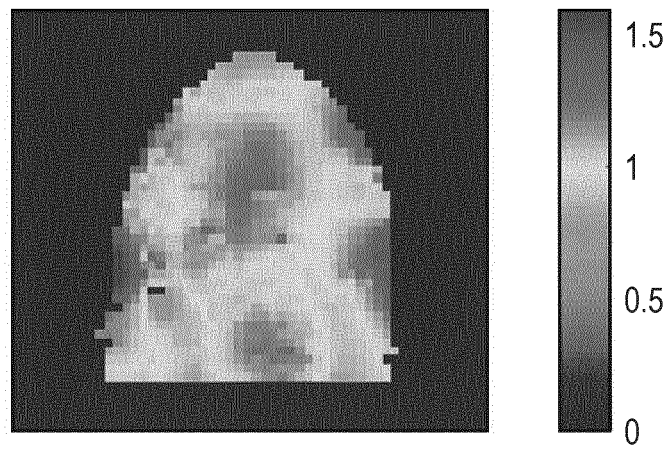

Test (simulation) results will now be described with reference to FIGS. 4 through 7C where:

FIG. 4 shows a partially cutaway front perspective view of a finite-difference time-domain (FDTD) numerical model of an ultra-high field radio-frequency (RF) transmit/receive apparatus 1 with a model head 8 therein in accordance with embodiments of the present invention; FIG. 5 shows a graph of a center transverse slice (S) of the model head 8 and the ultra-high field radio-frequency (RF) transmit/receive apparatus 1 taken along the third conducting ring of the model of FIG. 4 in accordance with embodiments of the present invention; FIG. 6 shows graphs of a normalized $|B_1^+|$-field (i.e., $|B_1^+|/|B_1^+|_{avg}$) for the center transverse, sagittal and coronal slices of the human head model 8 where $|B_1^+|_{avg}$ is the average $|B_1^+|$ over the center transverse, sagittal and coronal slices, acquired with an ultra-high field radio-frequency (RF) transmit/receive apparatus 1 with six electric dipole antennas 3 and three circular conducting rings 4, 5, 6 in accordance with embodiments of the present invention; FIG. 7 shows graphs of a normalized $|B_1^+|$-field (i.e., $|B_1^+|/|B_1^+|_{avg}$) for the center transverse, sagittal and coronal slices of the human head model 8 where $|B_1^+|_{avg}$ is the average $|B_1^+|$ over the center transverse, sagittal and coronal slices, acquired with an ultra-high field radio-frequency (RF) transmit/receive apparatus 1 with four electric dipole antennas 3 and three circular conducting rings 4, 5, 6 in accordance with embodiments of the present invention.

Referring to FIG. 4, the RF coil comprises a dipole-array based volume coil 2 which consists of six dipoles 3 and three circular conducting rings 4, 5, 6 radial surrounding the dipole-array based volume coil 2, and a cylindrical RF shield (not shown in FIG. 4). The RF coil may be loaded by a model head 8. The six dipoles 3 are arranged in a circular formation to form a dipole-array based volume coil 2. The dipole-array based volume coil 2 may have a diameter $d_{vc}$ of about 30 cm, and a length $L_{vc}$ of about 21.5 cm. Each dipole antenna 3 may have a length of 21.5 cm and a width of 2 cm. The RF shield (not shown in FIG. 4) may have the diameter of 35 cm and a length of 27.5 cm. The three circular conducting rings 4, 5, 6 may have the same diameter of 31 cm and a width of 1.5 cm. Each dipole antenna 3 is tuned to have the maximum current in the middle of each dipole antenna 3 with two inductors placed symmetrically on either side of the dipole antenna 3 with 5.5 cm apart from each other. The first conducting ring 4 and the conducting ring 5 are tuned to the resonant mode of uniform current distribution along the rings 4, 5 with evenly distributed capacitors. The third conducting rings 6 is tuned to the resonant mode of sinusoidal current distribution along the with evenly distributed capacitors. The dipole-array based volume coil 2 and the three circular rings 4, 5, 6 may be tuned to 298 MHz for a 7 Tesla (7 T) proton MRI. However, other tuning values are also envisioned and may be based upon the main magnetic field value of the MRI system. In FIG. 4 the total independent RF transmit channels are limited to eight.

Referring to FIG. 5, the center transverse slice (S) of the model head and the ultra-high field radio-frequency (RF) transmit/receive apparatus 1 taken along the third conducting ring 6 of the model of FIG. 4 in accordance with embodiments of the present invention is shown. Slice (S) may be situated substantially at the mid-plane of the dipole-array based volume coil 2. $|B_1^+|$ shimming for the center transverse slice (S) with the slice position shown in FIG. 4 will now be discussed with reference to FIGS. 6A through 7C. Optimum $|B_1^+|$ shimming may be achieved by minimizing the $|B_1^+|$ field standard deviation in the selected slice (e.g., slice (S) in the current embodiments) by independently varying amplitude and/or phase difference between eight transmit channels of the dipole-array based volume coil 2 and the three circular conducting rings 4, 5, 6.

Referring to FIG. 6 a normalized $|B_1^+|$-field (i.e., $|B_1^+|/|B_1^+|_{avg}$) for the center transverse, sagittal and coronal slices of the human head model is shown where $|B_1^+|_{avg}$ is the average $|B_1^+|$ over the center transverse, sagittal and coronal slices, acquired with an ultra-high field radio-frequency (RF) transmit/receive apparatus 1 with six electric dipole antennas 3 and three circular conducting rings 4, 5, 6 in accordance with embodiments of the present invention. For the center transverse slice the $|B_1^+|$ (deviation) is 0.07 and $|B_1^+|_{max}/|B_1^+|_{min}$ is 1.6; For the center sagittal slice the $|B_1^+|$ (deviation) is 0.13 and $|B_1^+|_{max}/|B_1^+|_{min}$ is 2.3; For the center coronal slice the $|B_1^+|$ (deviation) is 0.12 and $|B_1^+|_{max}/|B_1^+|_{min}$ is 2.4. As seen, $|B_1^+|$ uniformity after $|B_1^+|$-shimming is uniform enough for improved MR imaging quality at ultra-high fields.

Referring to FIG. 7 a normalized $|B_1^+|$-field (i.e., $|B_1^+|/|B_1^+|_{avg}$) for the center transverse, sagittal and coronal slices of the human head model is shown where $|B_1^+|_{avg}$ is the average $|B_1^+|$ over the center transverse, sagittal and coronal slices, acquired with an ultra-high field radio-frequency (RF) transmit/receive apparatus 1 with four electric dipole antennas 3 and three circular conducting rings 4, 5, 6 in accordance with embodiments of the present invention. For the center transverse slice the $|B_1^+|$ (deviation) is 0.07 and $|B_1^+|_{max}/|B_1^+|_{min}$ is 1.7; For the center sagittal slice the $|B_1^+|$ (deviation) is 0.13 and $|B_1^+|_{max}/|B_1^+|_{min}$ is 2.1 and for the center coronal slice the $|B_1^+|$ (deviation) is 0.12 and $|B_1^+|_{max}/|B_1^+|_{min}$ is 2.5. Also for the ultra-high field radio-frequency (RF) transmit/receive apparatus 1 with four electric dipole antennas 3 $|B_1^+|$ uniformity after $|B_1^+|$-shimming is uniform enough for improved MR imaging quality at ultra-high fields.

REFERENCE SYMBOL LIST

| | |
|---|---|
| radio-frequency (RF) transmit/receive apparatus | 1 |
| dipole-array based volume coil | 2 |
| straight dipole antenna | 3 |
| first conducting ring | 4 |

-continued

REFERENCE SYMBOL LIST

| | |
|---|---|
| second conducting ring | 5 |
| third conducting ring | 6 |
| RF shield | 7 |
| examination object | 8 |
| first port | 9 |
| second port | 10 |
| channel 5 | 11 |
| channel 6 | 12 |
| channel 7 | 13 |
| channel 8 | 14 |
| power splitter | 15 |
| phase shifter | 16 |
| quadrature hybrid coupler | 17 |
| load | 18 |
| channel 5 | 19 |
| channel 6 | 20 |
| channel 7 | 21 |
| channel 8 | 22 |

The invention claimed is:

1. An apparatus comprising:
a dipole-array based volume coil, the dipole-array based volume coil comprising a plurality of straight dipole antennas, wherein the straight dipole antennas are substantially parallel with each other, wherein the dipole-array based volume coil has a first axial end and a second axial end;
at least three circular conducting rings, including a first circular conducting ring, a second circular conductive ring, and a third circular conductive ring, wherein the three circular conducting rings radially surround the dipole-array based volume coil,
wherein the first circular conducting ring is located at the first axial end of the dipole-array based volume coil, wherein the second circular conducting ring is located at the second axial end of the dipole-array based volume coil, and
wherein the third circular conducting ring is located between the first circular conducting ring and the second circular conducting ring, surrounding a center of the dipole-array based volume coil,
wherein the first circular conducting ring, the second circular conducting ring, and the third circular conducting ring are substantially parallel with each other,
a cylindrical RF shield, situated about the dipole-array based volume coil and the at least three circular conducting rings;
a plurality of independent transmit/receive (T/R) radio frequency (RF) channels for driving the dipole-array based volume coil and the at least three circular conducting rings, wherein the plurality of independent T/R RF channels includes at least a first T/R RF channel, a second T/R RF channel, and a third T/R RF channel,
wherein at least the first T/R RF channel is assigned to the dipole-array based volume coil,
wherein the second T/R RF channel is assigned to at least one of the first circular conducting ring and the second circular conducting ring, wherein the third circular conducting ring has at least a first port and a second port, and
wherein the third T/R RF channel is assigned to at least one of the first and second ports of the third circular conducting ring for applying a set of quadrature drive signals to the third circular conducting ring.

2. The apparatus of claim 1, wherein the plurality of independent T/R RF channels includes a set of independent T/R RF channels, wherein the set of independent T/R RF channels includes at least one T/R RF channel which is assigned to each straight dipole antenna wherein the second T/R RF channel is assigned to both the first circular conducting ring and the second circular conducting ring, and wherein the third T/R RF channel is assigned to both the first port of the third circular conducting ring and the second port of the third circular conducting ring.

3. The apparatus of claim 2, wherein the apparatus further comprises a power splitter and a 180° phase shifter, wherein the second T/R RF channel is assigned to the first circular conducting ring and the second circular conducting ring through the power splitter and the 180° phase shifter.

4. The apparatus of claim 3, wherein the apparatus further comprises a quadrature hybrid coupler, wherein the third T/R RF channel is assigned to the first port of the third circular conducting ring and to the second port of the third circular conducting ring through the quadrature hybrid coupler, wherein the first port and the second port are 90° azimuthal apart along the third circular conducting ring.

5. The apparatus of claim 1, wherein the plurality of independent T/R RF channels further includes a fourth T/R RF channel and a fifth T/R RF channel, wherein the second T/R RF channel is assigned to the first circular conducting ring, wherein the fourth T/R RF channel is assigned to the second circular conducting ring, wherein the third T/R RF channel is assigned to the first port of the third circular conducting ring, wherein the fifth T/R RF channel is assigned to the second port of the third circular conducting ring, and wherein the plurality of independent T/R RF channels includes a set of independent T/R RF channels, wherein the set of independent T/R RF channels includes at least one T/R RF channel assigned to each straight dipole antenna.

6. The apparatus of claim 1, wherein the straight dipole antennas and the at least three circular conducting rings are tuned to a same resonant frequency of magnetic resonance imaging as each other.

7. The apparatus of claim 1, further comprising capacitors and/or inductors placed in each straight dipole antenna to tune the straight dipole antennas to have a maximum current in a middle of each straight dipole antenna.

8. The apparatus of claim 1, further comprising capacitors and/or inductors evenly distributed along the first circular conducting ring and along the second circular conducting ring for tuning the first circular conducting ring and the second circular conducting ring to a resonant mode with a uniform current distribution along the first circular conducting ring and along the second circular conducting ring.

9. The apparatus of claim 1, further comprising capacitors and/or inductors evenly distributed along the third circular conducting ring for tuning the third circular conducting ring to a resonant mode with a sinusoidal current distribution along the third circular conducting ring.

10. A magnetic resonance (MR) system, comprising an apparatus according to claim 1.

11. The apparatus of claim 2, wherein the straight dipole antennas and the at least three circular conducting rings are tuned to a same resonant frequency of magnetic resonance imaging as each other.

12. The apparatus of claim 5, wherein the straight dipole antennas and the at least three circular conducting rings are tuned to a same resonant frequency of magnetic resonance imaging as each other.

13. The apparatus of claim 1, further comprising at least one of a capacitor and an inductor provided in at least one of the straight dipole antennas to tune the straight dipole antenna to have a maximum current in a middle thereof.

14. The apparatus of claim 2, further comprising at least one of a capacitor and an inductor provided in at least one of the straight dipole antennas to tune the straight dipole antenna to have a maximum current in a middle thereof.

15. The apparatus of claim 5, further comprising at least one of a capacitor and an inductor provided in at least one of the straight dipole antennas to tune the straight dipole antenna to have a maximum current in a middle thereof.

16. The apparatus of claim 2, further comprising capacitors and/or inductors evenly distributed along the first circular conducting ring and along the second circular conducting ring for tuning the first circular conducting ring and the second circular conducting ring to a resonant mode with a uniform current distribution along the first circular conducting ring and along the second circular conducting ring.

17. The apparatus of claim 5, further comprising capacitors and/or inductors evenly distributed along the first circular conducting ring and along the second circular conducting ring for tuning the first circular conducting ring and the second circular conducting ring to a resonant mode with a uniform current distribution along the first circular conducting ring and along the second circular conducting ring.

18. The apparatus of claim 2, further comprising capacitors and/or inductors evenly distributed along the third circular conducting ring for tuning the third circular conducting ring to a resonant mode with a sinusoidal current distribution along the third circular conducting ring.

19. The apparatus of claim 5, further comprising capacitors and/or inductors evenly distributed along the third circular conducting ring for tuning the third circular conducting ring to a resonant mode with a sinusoidal current distribution along the third circular conducting ring.

* * * * *